Dec. 5, 1967 D. S. WILLARD 3,356,951

TRANSISTORIZED AMPLIFIER USING AN EMITTER FOLLOWER, A RESONANT CIRCUIT, AND A MIXER CONNECTED IN CASCADE

Filed Aug. 13, 1964 2 Sheets-Sheet 1

INVENTOR
D. S. WILLARD

BY

ATTORNEY
and
AGENT

INVENTOR
D. S. WILLARD

BY

Wade Koontz
ATTORNEY

James S. Shannon
AGENT 3,356,951

TRANSISTORIZED AMPLIFIER USING AN EMITTER FOLLOWER, A RESONANT CIRCUIT, AND A MIXER CONNECTED IN CASCADE

David S. Willard, High Rolls, N. Mex., assignor to the United States of America as represented by the Secretary of the Air Force Filed Aug. 13, 1964, Ser. No. 389,507
7 Claims. (Cl. 325—434)

The invention described herein may be manufactured and used by or for the United States Government for governmental purposes without the payment to me of any royalty thereon.

It is the purpose of this invention to provide a stable transistorized radio frequency amplifier which is suitable for use in a multiple superheterodyne receiver and suitable for use with shunt diode automatic volume control.

Great care has been necessary in the design of transistorized high gain radio frequency amplifiers in order to avoid self oscillation. These circuits have usually incorporated some kind of neutralizing arrangement to prevent or cancel the oscillation causing feedback. Neutralizing circuits are notoriously critical and difficult to adjust. It is the principal object of the invention to provide a transistorized radio frequency amplifier that is inherently stable, simple and non-critical.

Briefly, the amplifier in accordance with the invention comprises a cascade of similar amplifying networks each of which comprises three cascaded elements, namely, an emitter follower, a resonant circuit and a mixer. The input signal is applied to the emitter follower which has power gain but no voltage gain and is therefore inherently stable. The power supplied by the emitter follower is used to drive a resonant circuit which provides voltage step-up. The signal thus increased in voltage is applied to the mixer along with a local oscillator signal of different frequency. The output of the mixer is tuned to the difference in these two frequencies. The mixer provides both voltage and power amplification and, since its output frequency is different from its input frequency, is inherently stable. The overall amplifying network is therefore inherently stable. Several such networks may be connected in cascade to provide the desired gain. A single local oscillator may be used for all networks or separate oscillators may be used. Since the input impedance of the mixer is relatively high, a shunt diode of controllable conductance may be used at this point for gain control.

A more detailed description of the invention will be given with reference to the specific embodiment thereof shown in the accompanying drawings in which:

FIG. 3 is a modification of FIG. 2.

Figure 1:
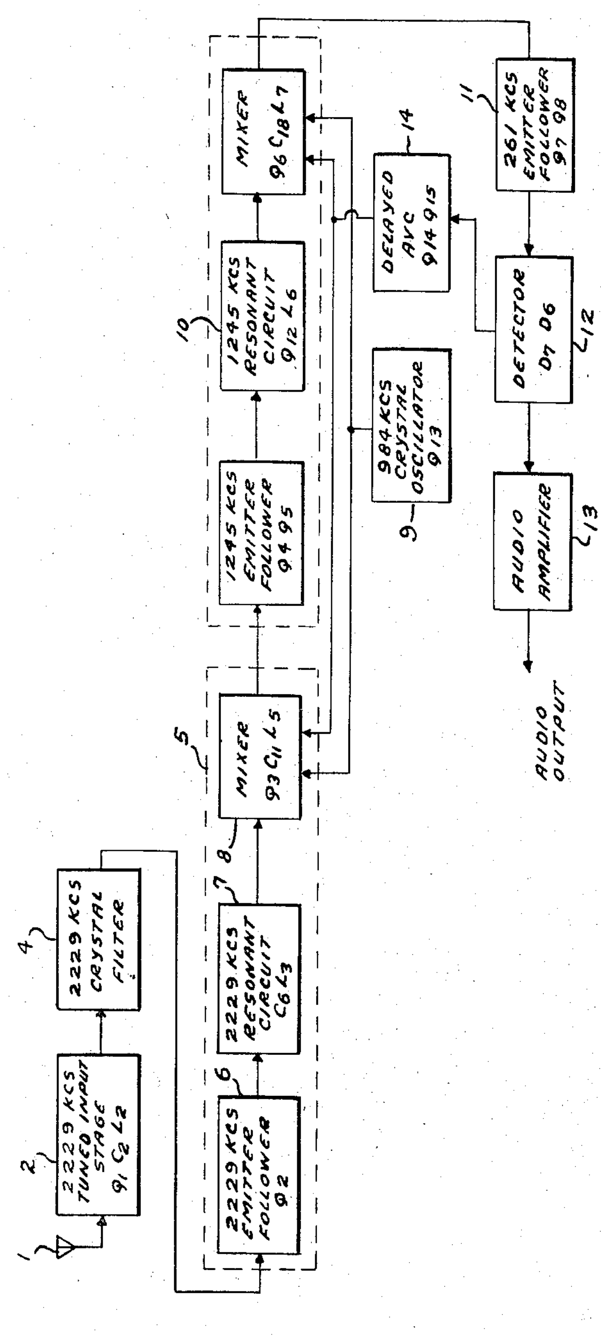
FIG. 1 is a block diagram of a receiver incorporating the invention.
Figure 2:
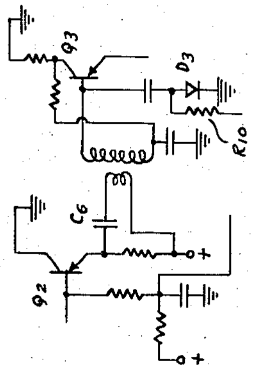
FIG. 2 is a schematic diagram of a receiver constructed in accordance with the block diagram of FIG. 1.
Figure 2:
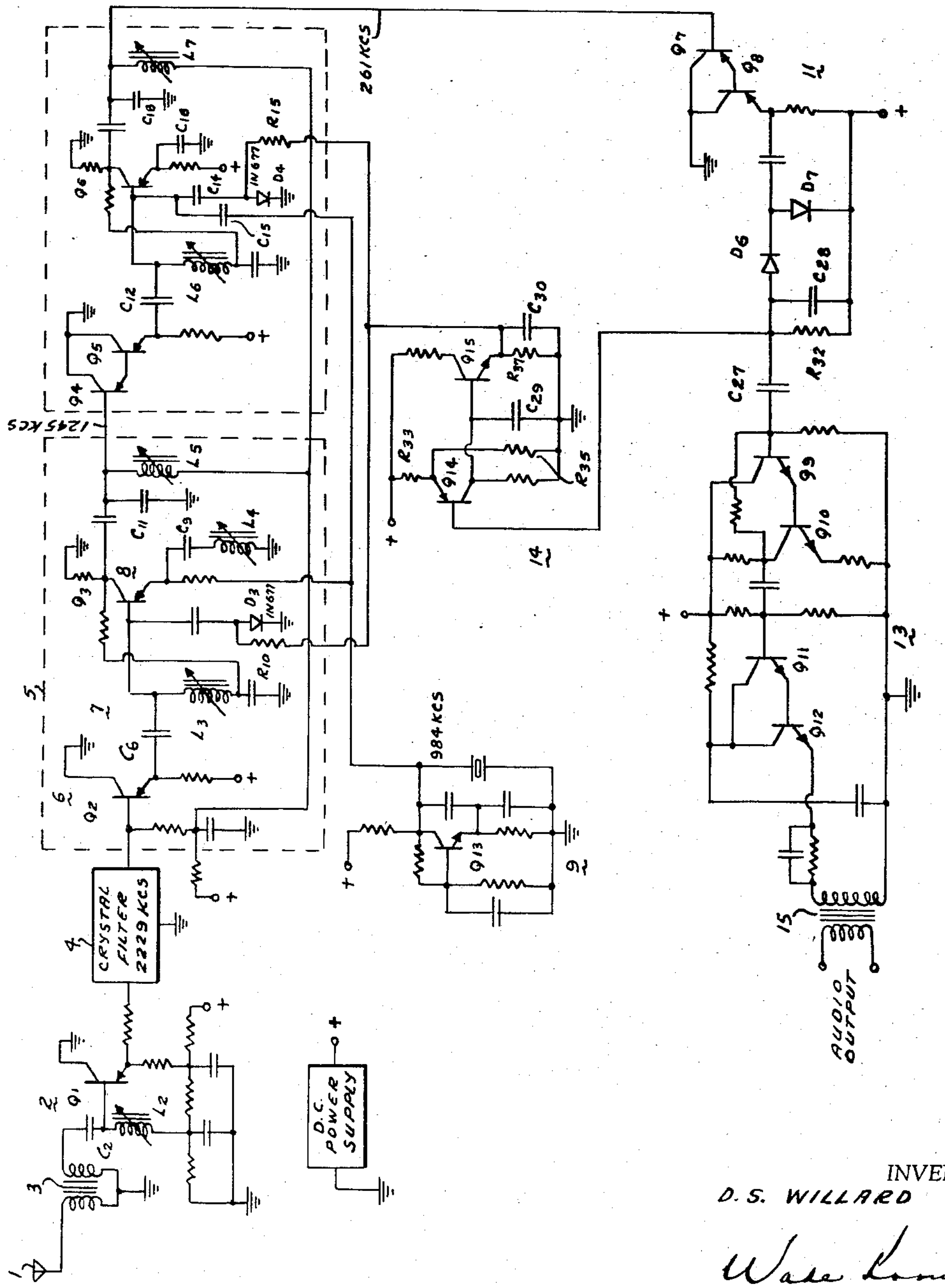

Referring to FIGS. 1 and 2, the receiver shown is designed to operate at a fixed reception frequency, in this case 2229 kc. s. The signal received by antenna 1 is applied to tuned input stage 2 in which it is coupled by transformer 3 to a series resonant circuit $C_2$–$L_2$ tuned to 2229 kc. s. The resulting signal across $L_2$ is introduced into the base-emitter circuit of transistor $Q_1$ which is connected as an emitter follower. Stage 2 therefore provides selectivity through tuned circuit $C_2$–$L_2$ and power amplification through emitter follower $Q_1$.

The output of emitter follower $Q_1$ is applied to crystal filter 4 which has a narrow pass band centered on 2229 kc. s. to provide additional selectivity.

The output of filter 4 is applied to the input of an amplifying network 5 of the type already briefly described. This network consists of an emitter follower stage 6, a resonant circuit 7 and a mixer stage 8. The emitter follower stage of transistor $Q_2$ provides power gain but no voltage gain. Because there is no voltage gain, due to the substantially total negative feedback of the output signal, the emitter follower stage is inherently stable and free from self-oscillation.

The output of the emitter follower stage, which acts as a very low impedance source, is applied across a series resonant circuit made up of capacitor $C_6$ and inductance $L_3$ tuned to 2229 kc. s. Since the voltages across $C_6$ and $L_3$ are nearly 180° out of phase, either of them is much greater than their vector sum which is the output voltage of the emitter follower so that the circuit provides voltage amplification of the emitter follower output. A tuned step-up transformer may be used instead of the series resonant circuit if desired, as shown in FIG. 3. In this case $C_6$ and the inductance at the primary terminals of the transformer are in series resonance.

The transistor $Q_3$ and associated common emitter circuit act as a mixer to intermodulate the received frequency with the frequency, 984 kc. s., of the crystal controlled local oscillator 9 incorporating $Q_{13}$. For this purpose the signal across $L_3$ and the signal produced by local oscillator 9 are applied to the base-emitter circuit of $Q_3$. The difference frequency, 1245 kc. s., is selected from the mixer output by parallel resonant circuit $C_{11}$–$L_5$ tuned to this frequency. The series resonant circuit $C_9$–$L_4$ is tuned to 2229 kc. s. and serves to bypass current of this frequency around the local oscillator. The mixer stage provides both voltage and power gain but is inherently free from self-oscillation since its output frequency is different from its input frequency.

The amplifying network 5 is therefore inherently stable. Its output is applied to a similar amplifying network 10 which is the same in principle as network 5. In network 10, the emitter follower comprises two transistors $Q_4$ and $Q_5$, rather than a single transistor, and the local oscillator frequency is injected through $C_{15}$ to the base of mixer transistor $Q_6$. As in network 5, the series circuit $C_{12}$–$L_6$ is tuned to the incoming frequency, 1245 kc. s., and the parallel circuit $C_{18}$–$L_7$ is tuned to the difference frequency, 261 kc. s. $C_{16}$ bypasses the emitter resistor for the two frequencies.

The output of network 10 is applied through an emitter follower stage 11 comprising transistors $Q_7$ and $Q_8$ to a detector circuit 12 comprising diodes $D_6$ and $D_7$. $R_{32}$ and radio frequency bypass capacitor $C_{28}$ constitute the detector output impedance. Across this impedance are developed an alternating component corresponding to the amplitude modulation of the received carrier and a direct component proportional to the received carrier strength.

The modulation component across $R_{32}$ is applied through blocking capacitor $C_{27}$ to an audio frequency amplifier 13 having a voltage amplifying stage comprising transistors $Q_9$ and $Q_{10}$ and a power stage comprising transistors $Q_{11}$ and $Q_{12}$ connected as an emitter follower. The audio output is taken from transformer 15 connected in the emitter circuit of $Q_{12}$.

The gains of amplifying networks 5 and 9 may be controlled by the shunting actions of diodes $D_3$ and $D_4$ which are connected across the relatively high impedance inputs of mixers $Q_3$ and $Q_6$, respectively, by means of direct current blocking capacitors $C_8$ and $C_{14}$. The shunting effect of the diodes depends upon their conductance which in turn depends upon the amount of positive bias applied to their anodes.

Automatic volume control (AVC) is achieved in the receiver shown by controlling the conductance of $D_3$ and $D_4$ in accordance with the direct component of the voltage across $R_{32}$. First, this voltage is amplified in a direct current amplifier 14 comprising transistors $Q_{14}$ and $Q_{15}$, the modulation ripple being removed by capacitors $C_{29}$ and $C_{30}$. The smoothed and amplified direct voltage across $R_{37}$ is then applied to the anodes of $D_3$ and $D_4$ through $R_{10}$ and $R_{15}$, respectively. With this arrangement, any change in voltage across $R_{32}$ changes the conductance of $D_3$ and $D_4$, and thereby the gains of networks 5 and 9, in such direction as to oppose the change, in this manner holding the voltage across $R_{32}$ substantially constant with changes in received signal strength. An amplitude delay may be incorporated in the automatic volume control system by biasing Q14, through proper selection of $R_{33}$ and $R_{35}$, to be inoperative until the voltage across $R_{32}$ has reached a predetermined value. This insures that the receiver gain will be maximum for weak signals below the AVC threshold. Because of the different operating frequencies of the amplifying networks 5 and 9, any feedback through the AVC system that may occur will not produce instability.

Although only two cascaded amplifying networks, 5 and 10, are employed in the receiver shown, a larger number may be used as determined by the overall gain requirements. Also, more than two networks may be supplied from a single local oscillator by a judicious choice of the oscillator frequency. Further, it is of course not necessary that the amplifying networks be used in a fixed frequency receiver as shown. In the case of a tunable receiver, the local oscillator 9 would be of a tunable type and would supply only the first amplifying network 5. The tuning control of this oscillator would be ganged to the R.F. tuning controls of the receiver in the usual manner to provide a constant intermediate frequency at the output of network 5. Another fixed frequency local oscillator would be used to supply network 10 and any additional amplifying networks that may be used.

I claim:

1. An amplifying network for modulated radio frequency waves, said network having an input and an output and comprising a power amplifier having no voltage gain, a passive resonant circuit capable of producing voltage gain and a frequency changer connected in cascade in the order named between the input and the output, said resonant circuit being tuned to the frequency of the incoming wave to said network.

2. An amplifying network for modulated radio frequency waves, said network having an input and an output and comprising: an emitter follower stage having its input connected to the input of said network; a capacitive reactive element and an inductive reactive element connected in series across the output of said emitter follower stage and forming a series resonant circuit tuned to the frequenacy of the input wave to said network; a mixing stage having a transistor as the intermodulating element; a local oscillator operating at a frequency different from the frequency of said input wave; means for applying the signal appearing across one of the reactive elements in said series resonant circuit to said mixing stage; means for applying the output of said local oscillator to said mixing stage; and means coupling the output of said mixing stage to the output of said network, said means comprising a parallel reasonant circuit tuned to the difference between said local oscillator frequency and the frequency of the input wave to the network.

3. Apparatus as claimed in claim 2 in which a blocking capacitor and a variable impedance diode are connected in series across the said one reactive element of said series resonant circuit from which a signal is applied to said mixing stage, and means for varying the bias on said diode for varying its impedance and thereby the gain of the amplifying network.

4. An amplifier for modulated radio frequency waves comprising a plurality of similar amplifying networks connected in cascade, each network having an input and an output and each containing a power amplifier having no voltage gain, a passive resonant circuit capable of producing voltage gain and a frequency changer connected in cascade in the order named between the input and the output, said resonant circuit being tuned to the frequency of the incoming wave to said network.

5. An amplifier for modulated radio frequency waves comprising a plurality of similar amplifying networks connected in cascade and a local oscillator supplying the same local oscillator frequency to each of said networks, each of said networks having an input and an output and containing: an emitter follower stage having its input connected to the input of said network; a capacitive reactive element and an inductive reactive element connected in series across the output of said emitter follower stage and forming a series resonant circuit tuned to the frequency of the input wave to said network; a mixing stage having a transistor as the intermodulating element; means for applying the signal appearing across one of said reactive elements in said series resonant circuit to said mixing stage; means for applying said local oscillator frequency to said mixing stage; and means coupling the output of said mixing stage to the output of said network, said means comprising a parallel resonant circuit tuned to the difference between said local oscillator frequency and the frequency of said input wave.

6. Apparatus as claimed in claim 5 in which each of said networks further contains a blocking capacitor and a variable impedance diode connected in series across the said one reactive element of said series resonant circuit from which a signal is applied to said mixing stage, and means for varying the bias on said diode for varying its impedance and thereby the gain of the amplifying network.

7. A receiver for an amplitude modulated radio frequency carrier wave comprising an input stage selectively tuned to the carrier frequency, a plurality of similar radio frequency amplifying networks, an amplitude modulation detector and a modulation frequency amplifier all connected in cascade in the order named, said detector producing in addition to the modulation of said carrier a direct control voltage proportional to the average amplitude of the radio frequency output of the next preceding amplifying network, means for amplifying said control voltage and for applying the amplified control voltage to each of said amplifying networks, a local oscillator and means for applying the local oscillator frequency to each of said amplifying networks, each of said amplifying networks having an input and an output and containing: an emitter follower stage having its input connected to the input of the network, a capacitive reactive element and an inductive reactive element connected in series across the output of said emitter follower stage and forming a series resonant circuit tuned to the frequency of the input wave to said network, a mixing stage having a transistor as an intermodulating element, means for applying the signal appearing across one of said reactive elements in said series resonant circuit to said mixing stage, a blocking capacitor and a variable impedance diode connected in series across said one reactive element, means for applying said amplified control voltage between the anode and cathode of said diode, means for applying said local oscillator frequency to said mixing stage, and means coupling the output of said mixing stage to the output of said network comprising a parallel resonant circuit tuned to the difference between said local oscillator frequency and the frequency of the input wave to the network.

No references cited.

KATHLEEN H. CLAFFY, *Primary Examiner.*

R. S. BELL, *Assistant Examiner.*